United States Patent
Thamby et al.

(12)

(10) Patent No.: US 6,841,859 B1
(45) Date of Patent: Jan. 11, 2005

(54) PREMOLDED CAVITY IC PACKAGE

(75) Inventors: Labeeb Sadak Thamby, Hong Kong (HK); Neil McLellan, Hong Kong (HK); Hugo Chi Wai Wong, Hong Kong (HK); William Lap Keung Chow, Hong Kong (HK)

(73) Assignee: Asat Ltd., New Territories (HK)

( * ) Notice: Subject to any disclaimer, the term of this patent is extended or adjusted under 35 U.S.C. 154(b) by 0 days.

(21) Appl. No.: 10/800,973

(22) Filed: Mar. 16, 2004

Related U.S. Application Data

(62) Division of application No. 10/232,678, filed on Sep. 3, 2002.

(51) Int. Cl.[7] .............................................. H01L 23/495
(52) U.S. Cl. ......................... 257/676; 257/687; 257/667
(58) Field of Search .................................. 257/667–727

(56) References Cited

U.S. PATENT DOCUMENTS

| | | | |
|---|---|---|---|
| 4,584,767 A | 4/1986 | Gregory | 29/848 |
| 4,710,419 A | 12/1987 | Gregory | 428/210 |
| 5,138,431 A | 8/1992 | Huang et al. | 257/677 |
| 5,289,034 A * | 2/1994 | Hundt | 257/678 |
| 5,366,933 A | 11/1994 | Golwalkar et al. | 29/827 |
| 5,545,922 A | 8/1996 | Golwalkar et al. | 257/676 |
| 5,700,697 A | 12/1997 | Dlugokecki | 438/4 |
| 5,846,477 A | 12/1998 | Hotta et al. | 264/511 |
| 5,869,883 A * | 2/1999 | Mehringer et al. | 257/667 |
| 5,910,686 A | 6/1999 | Hamzehdoost et al. | 257/778 |
| 6,144,571 A * | 11/2000 | Sasaki et al. | 363/144 |
| 6,146,924 A | 11/2000 | Chang et al. | 438/126 |
| 6,211,462 B1 | 4/2001 | Carter et al. | 174/52.4 |
| 6,229,200 B1 | 5/2001 | McLellan et al. | |
| 6,335,224 B1 | 1/2002 | Peterson et al. | 438/114 |
| 6,498,099 B1 | 12/2002 | McLellan et al. | |
| 6,577,000 B2 * | 6/2003 | Sato et al. | 257/730 |

\* cited by examiner

*Primary Examiner*—Michael Lebentritt
(74) *Attorney, Agent, or Firm*—Keating & Bennett LLP

(57) ABSTRACT

A process for fabricating a cavity-type integrated circuit package. The process includes: supporting an interior portion of each of a plurality of leads, in a mold; supporting a die attach pad in said mold; molding a package body in said mold such that said leads extend from an interior cavity of said package body to an exterior thereof; mounting a semiconductor die to said die attach pad; wire bonding various ones of said leads to said semiconductor die; adding a fill material for covering at least a surface of said interior portion of said leads; and mounting a lid on said package body for enclosing said die in said cavity of said package body.

2 Claims, 7 Drawing Sheets

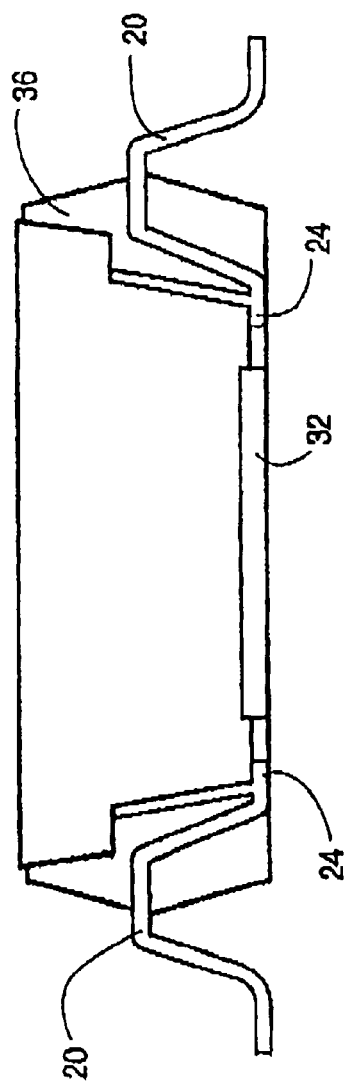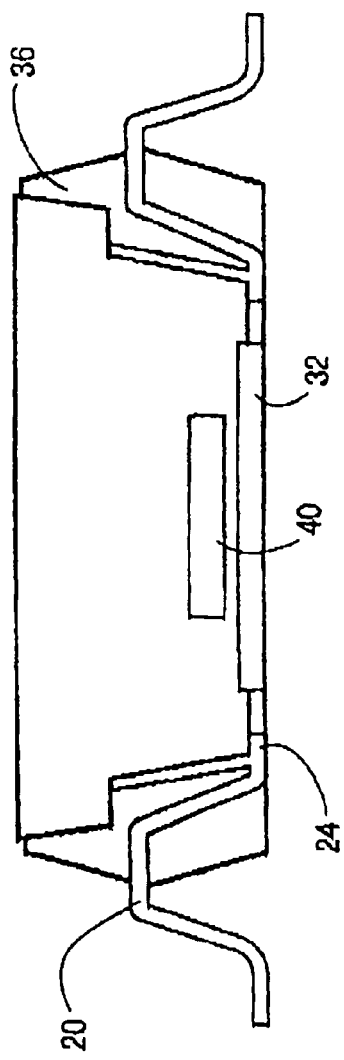

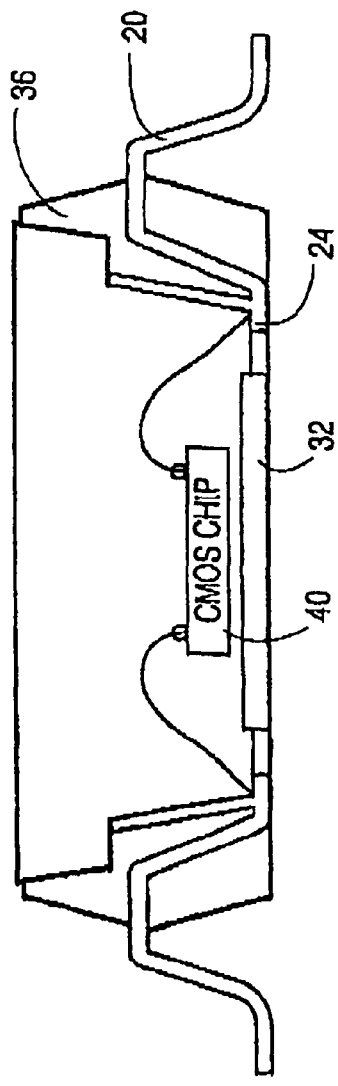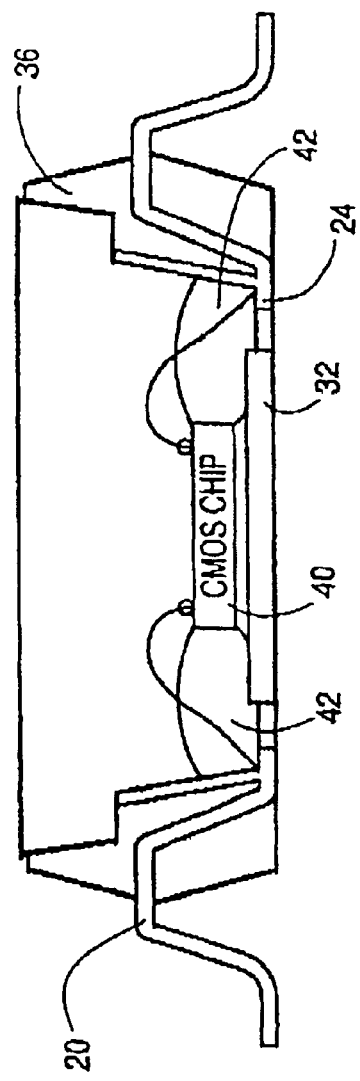

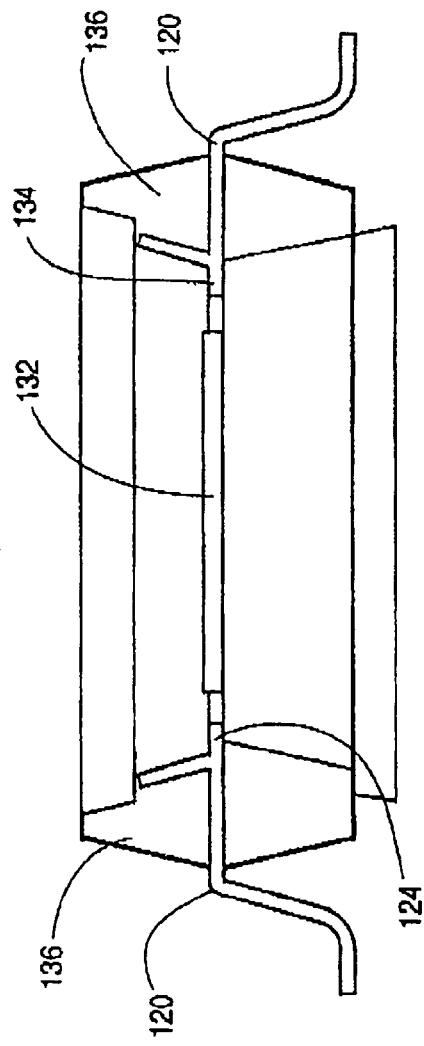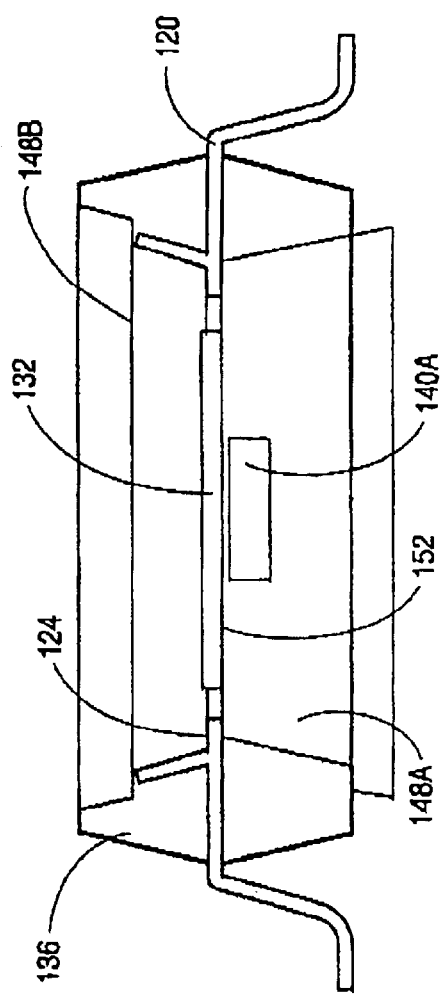

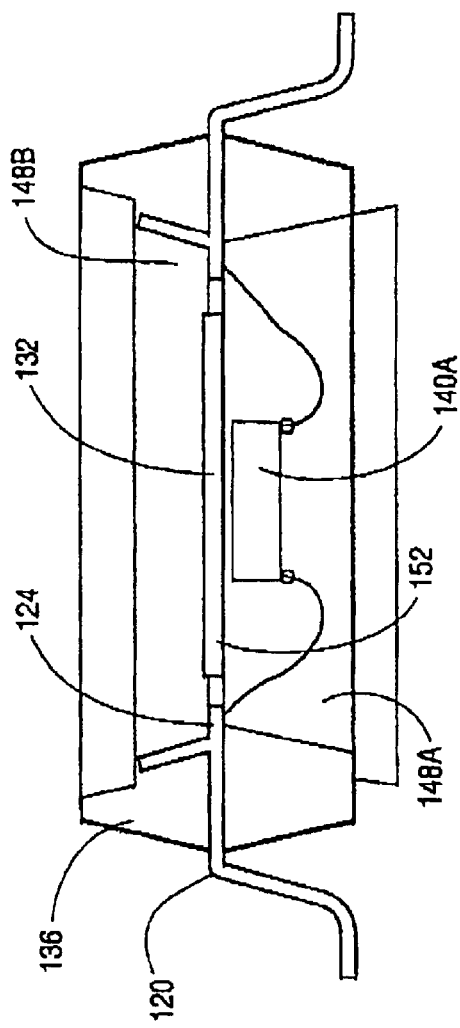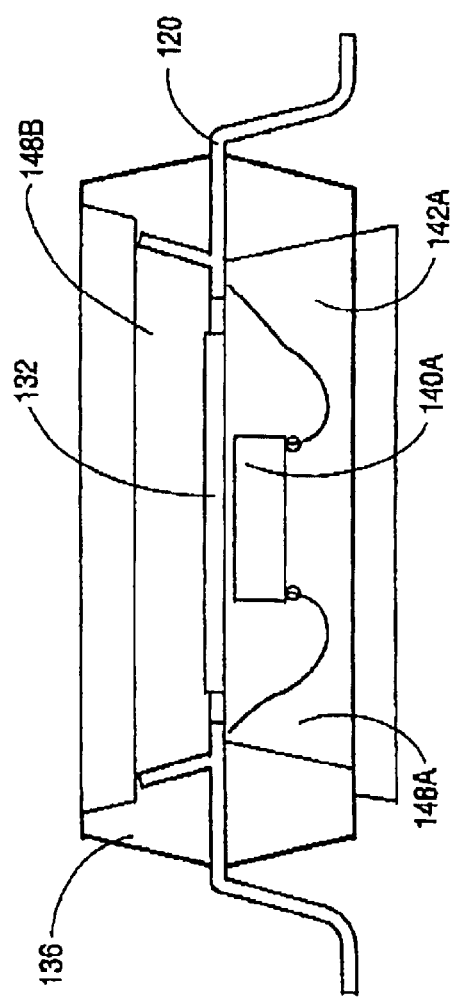

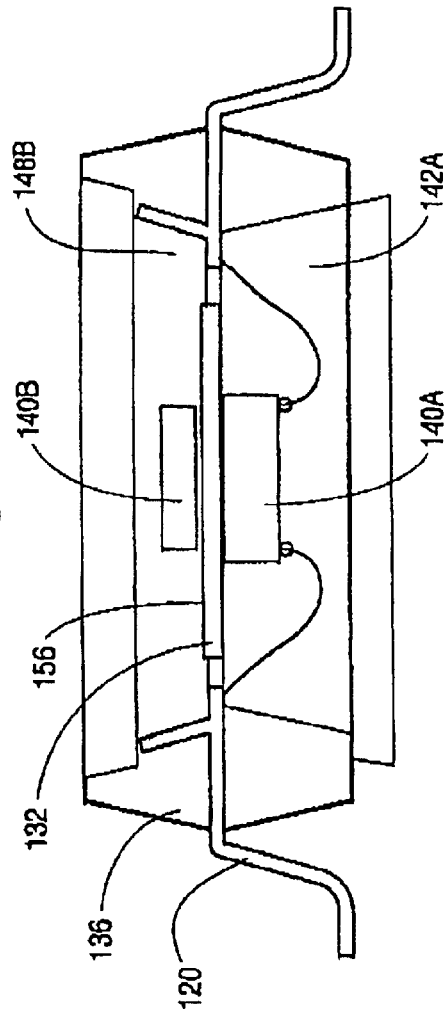
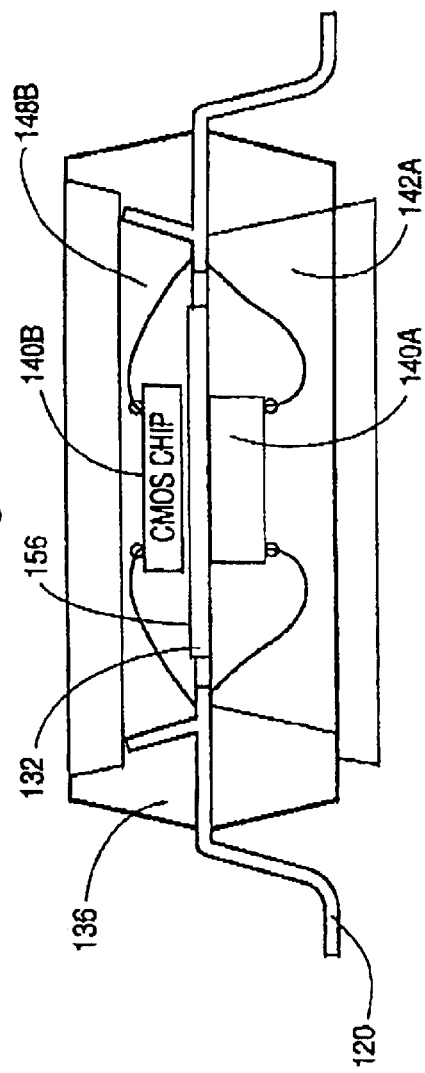

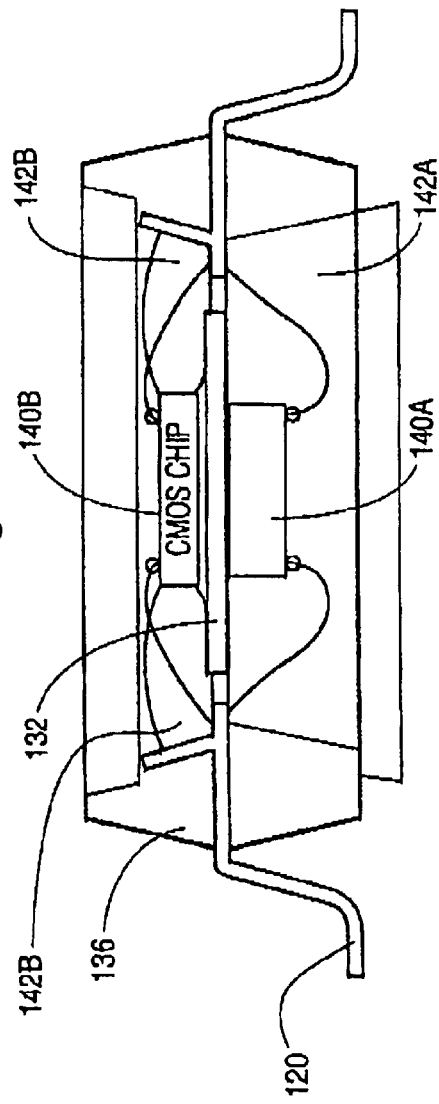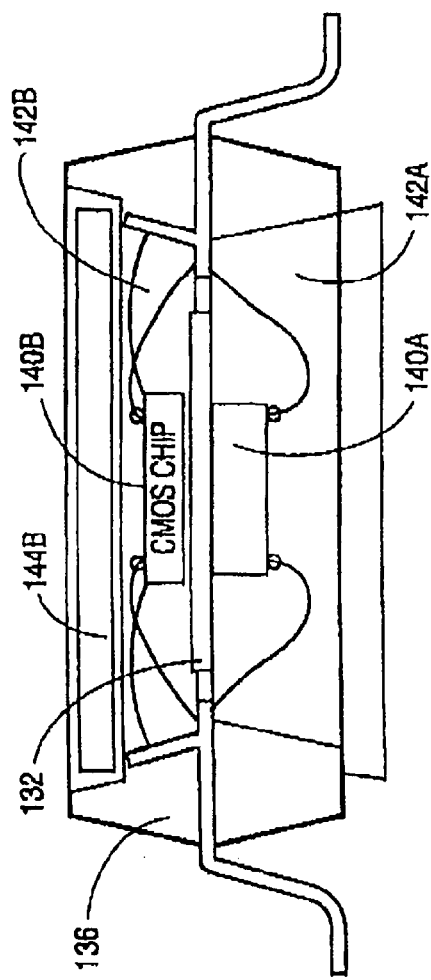

PREMOLDED CAVITY IC PACKAGE

This application is a Divisional of U.S. patent application Ser. No. 10/232,678 filed Sep. 3, 2002, currently pending.

FIELD OF THE INVENTION

The present invention relates in general to integrated circuit packaging, and more particularly to an improved process for fabricating a premolded cavity integrated circuit package that includes a feature to inhibit mold contamination of the inner lead bonding area.

BACKGROUND OF THE INVENTION

Cavity-type IC packages are useful in imaging devices such as CMOS imaging or CCD display applications for still or video cameras. The package includes a die at the base of a cavity and a clear lid epoxied on top. The use of a cavity-type IC package is advantageous for high frequency applications as the gold interconnect wires between the die attach pad and the contacts span an air gap rather than travelling through mold compound. The air has a lower dielectric constant than the mold compound and therefore the electrical impedance of the gold wire is much lower when the wire runs through air rather than through the mold compound. Thus signal distortion at high frequencies is inhibited.

Prior art cavity-type IC packages include ceramic body IC packages such as the Ceramic PGA cavity package traditionally used for microprocessors. However, these packages are cost prohibitive.

Other prior art packages include ball grid array (BGA) packages for use in imaging or camera applications. These packages are fabricated with a rim of high viscosity epoxy and a glass lid placed thereon. Again, these packages are cost prohibitive as they employ a substrate rather than a less-expensive leadframe.

The PANDA PACK, a well-known QFP (Quad Flat Pack) cavity style package, provides an air gap spanned by the gold interconnect wires. However, the inner leads of these packages are not supported and the mold flash must be cleaned from the leads for the gold wire to stick to the inner leads during wire bonding. Cleaning and wire bonding is difficult and therefore is not always successful.

SUMMARY OF THE INVENTION

According to an aspect of the present invention there is provided a process for fabricating a cavity-type integrated circuit package. The process includes: supporting an interior portion of each of a plurality of leads, in a mold; supporting a die attach pad in said mold; molding a package body in said mold such that said leads extend from an interior cavity of said package body to an exterior thereof; mounting a semiconductor die to said die attach pad; wire bonding various ones of said leads to said semiconductor die; adding a fill material for covering at least a surface of said interior portion of said leads; and mounting a lid on said package body for enclosing said die in said cavity of said package body.

According to another aspect of the present invention there is provided a process for fabricating a cavity-type integrated circuit package. The process includes: supporting an interior portion of each of a plurality of leads, in a mold; supporting a die attach pad in said mold; molding a package body in said mold such that said leads extend from an interior of said package body to an exterior thereof; mounting a first semiconductor die in a first cavity of said package body, to a first side of said die attach pad; wire bonding various ones of said leads to said first semiconductor die; adding a fill material to substantially fill said first cavity of said package body; mounting a second semiconductor die in a second cavity of said package body, to a second side of said die attach pad; wire bonding various ones of said leads to said second semiconductor die; adding a fill material to said second cavity for covering at least a surface of said interior portion of said leads; and mounting a lid on said package body for enclosing said second semiconductor die in said second cavity in said package body.

In yet another aspect of the present invention there is provided a cavity-type integrated circuit package. The package includes: a premolded package body; a plurality of leads, each lead extending from an interior of said package body to an exterior thereof; a first semiconductor die mounted to a first side of a die attach pad, in a first cavity of said package body; a first plurality of wire bonds connecting various ones of said leads and said first semiconductor die; a first fill material substantially filling said first cavity of said package body; a second semiconductor die mounted to a second side of said die attach pad in said package body; a second plurality of wire bonds connecting various ones of said leads and said second semiconductor die; a second fill material covering a portion of said plurality of leads; and a lid for enclosing said second semiconductor die and said second plurality of wire bonds in said package body.

In one aspect of the invention, an air cavity in the interior of the package body and the clamped inner portion of the leads inhibits mold flash from contaminating a surface thereof, providing a clean wire bondable surface.

BRIEF DESCRIPTION OF THE DRAWINGS

The invention will be better understood with reference to the drawings in which:

FIGS. 1A–1E show processing steps for manufacturing a cavity-type integrated circuit package according to a preferred embodiment of the present invention.

FIGS. 2A–2H show processing steps for manufacturing a cavity type integrated circuit package according to another embodiment of the present invention.

DETAILED DESCRIPTION OF THE PREFERRED EMBODIMENT

Figure 1E:
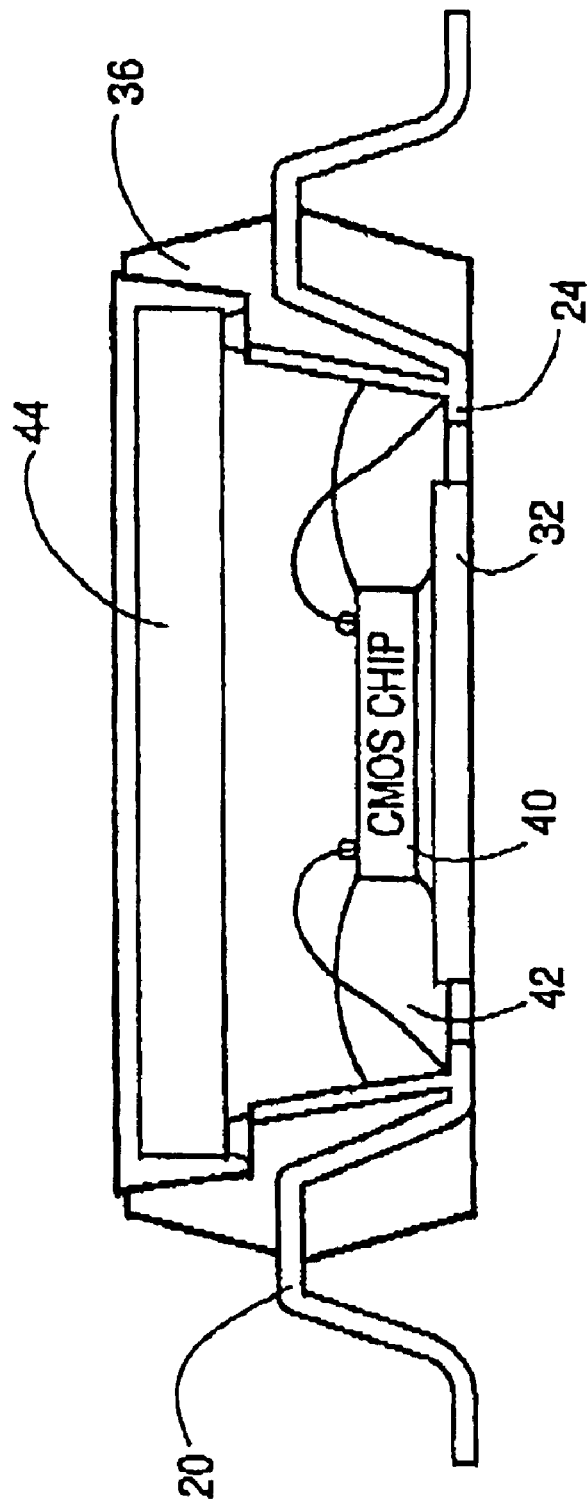

With reference to FIGS. 1A to 1E, each of a plurality of formed leads 20 is supported by clamping an interior portion 24 of the leads 20 between a top and a bottom mold cavity in an appropriately shaped mold (not shown). A die attach pad 32 is held at the four corners by tie bars on a leadframe.

A package body 36 is then molded in the mold such that the formed leads 20 extend from an interior of the package body 36 to an exterior thereof, as best shown in FIG. 1A. The package body 36 is then removed from the mold.

Next, a semiconductor die 40 is fixed to the die attach pad 32 using conventional techniques, for example, using epoxy or film, as shown in FIG. 1B. This is followed by standard wire bonding of the interior portion 24 of the leads 20 to the semiconductor die 40, as shown in FIG. 1C.

Referring now to FIG. 1D, a fill material (glob top fill) 42 is added to the cavity, generally between the semiconductor die 40 and the package body 36. The glob top fill 42 covers the interior portion 24 of the leads 20 and partially covers the wire bonding in the interior of the package body 36. The glob top fill 42 is an epoxy resin for mechanically supporting the package and protecting the wire bonds and semiconductor die.

Next, the interior of the package body 36 is cleaned to remove contaminants on the die surface or the interior of the package body 36. Various known techniques are used to clean the package body 36, such as dry air blowing, plasma cleaning and carbon dioxide ($CO_2$) gas jet cleaning, as will be understood by those skilled in the art.

With reference to FIG. 1E, a lid 44 is mounted on the package body 36 using an epoxy for sealing the package body 36. In the present embodiment the lid 44 is a plastic. Other suitable materials can be used for the lid 44, such as glass or metal, as will occur to those of skill in the art. It will now be understood that a cavity 48 is enclosed by the lid 44 on the package body 36.

After mounting the lid 44, the package body 36 is saw singulated to produce the finished IC package.

Referring now to FIGS. 2A to 2E, another embodiment of the present invention will be described using similar reference numerals raised by 100. Similar to the first embodiment, each of a plurality of formed leads 120 is supported at an interior portion 124 thereof, between top and bottom cavity bars of an appropriately shaped mold (not shown). Similar to the first embodiment, a die attach pad 132 is held at four corners by tie bars on a leadframe.

A package body 136 is then premolded such that the formed leads 120 extend from an interior of the package body 136 to an exterior thereof, as shown in FIG. 2A. The package body 136 is then removed from the mold.

In the present embodiment, the package body 136 is double sided, having first and second cavities 148A and 148B, respectively, on opposing sides of the die attach pad 132. A semiconductor sensor die 140A is mounted on a first side 152 of the die attach pad 132 using conventional techniques, as shown in FIG. 2B. Standard wire bonding of the interior portion 124 of the leads 120 to the sensor die 140A follows, as shown in FIG. 2C.

Referring now to FIG. 2D, glob top fill 142A is added to the first cavity 148A. The glob top fill 142A substantially fills the first cavity 148A, covering the portion of the leads 120 in the interior of the package body 136, the wire bonding and the semiconductor die 140A.

Next, a controller chip 140B is mounted on a second side 156 of the die attach pad 132, as shown in FIG. 2E. Standard wire bonding of the leads 120 to the controller chip 140B follows, as shown in FIG. 2F.

Referring now to FIG. 2G, a glob top fill 142B is added to the second cavity 148B, generally between the controller chip 140B and the package body 136. The glob top fill 142B covers the portion of the leads 120 in the interior of the package body 136 and partially covers the wire bonding.

Next, the second cavity 148B is cleaned to remove contaminants on the surface of the chip 140B and in the second cavity 148B.

Referring to FIG. 2H, a lid 144B is mounted on the package body 136 using an epoxy for sealing the second cavity 148B. The lid 144B encloses the controller chip 140B in the second cavity 148B. In the present embodiment, the lid 144B is glass but other suitable materials, such as plastic or metal can be used After mounting the lid 144B, the package body 136 is saw singulated to produce the finished IC package.

Alternatives and variations of the present invention are possible, as may occur to those skilled in the art. For example, the first embodiment can include a leadframe array format as described in Applicant's copending U.S. patent application Ser. Nos. 09/095,803 and 09/288,352, the contents of which are incorporated herein by reference. In such case, a package body is premolded on the leadframe. All other steps in the process are similar to those described in the first embodiment.

In the second embodiment described above, a semiconductor sensor die 140A is mounted on the first side 152 of the die attach pad 132 and a controller chip 140B is mounted on the second side 156 of the die attach pad. It will be understood that this is one example of a chip/semiconductor die combination and other combinations are possible. Exemplary combinations include a memory chip mounted on the first side with a contoller chip mounted on the second side, memory chips mounted on both sides, and an SiGe die mounted on the first side with a CMOS die mounted on the second side.

Also, these double die packages can have a pair of cavities, one on each side of the die attach pad. In this case, the glob top fill 142A does not fill the first cavity 148A, but instead covers the portion of the leads 120 in the interior of the package body 136 and partially covers the wire bonding. Then, the first cavity 148A is cleaned to remove contaminants on the surface of the die 140A and in the first cavity 148A and a lid is mounted on the package body 136 using an epoxy for sealing the first cavity 148A. Thus, the lid encloses the semiconductor sensor die 140A in the first cavity 148A.

All such embodiments and modifications are believed to be within the sphere and scope of the invention as defined by the claims appended hereto.

What is claimed is:

1. A cavity-type integrated circuit package comprising:

a premolded package body;

a plurality of leads, each lead extending from an interior of said package body to an exterior thereof;

a first semiconductor die mounted to a first side of a die attach pad, in a first cavity of said package body;

a first plurality of wire bonds connecting various ones of said leads and said first semiconductor die;

a first fill material substantially filling said first cavity of said package body;

a second semiconductor die mounted to a second side of said die attach pad in said package body;

a second plurality of wire bonds connecting various ones of said leads and said second semiconductor die;

a second fill material covering a portion of said plurality of leads; and a lid for enclosing said second semiconductor die and said second plurality of wire bonds in said package body.

2. The cavity-type integrated circuit package according to claim 1, wherein said first fill material is the same as said second fill material.

* * * * *